United States Patent
Becker et al.

(10) Patent No.: US 9,076,901 B2
(45) Date of Patent: Jul. 7, 2015

(54) PROCESS AND APPARATUS FOR PRODUCING A GLASS SHEET COATED WITH A SEMICONDUCTOR MATERIAL

(75) Inventors: Frank Becker, Leipzig (DE); John Bohland, Folsom, CA (US); Hubert Joachim Frenck, Bitterfeld-Wolfen (DE); Michael Bauer, Leipzig (DE); Robert Fischer, Halle/Saale (DE); Kenneth R. Kormanyos, Berkey, OH (US); Norman W. Johnston, Perrysburg, OH (US)

(73) Assignee: Calyxo GMBH, Bitterfeld-Wolfen (DE)

( * ) Notice: Subject to any disclaimer, the term of this patent is extended or adjusted under 35 U.S.C. 154(b) by 418 days.

(21) Appl. No.: 13/695,167

(22) PCT Filed: Apr. 20, 2011

(86) PCT No.: PCT/EP2011/002002
§ 371 (c)(1),
(2), (4) Date: Dec. 10, 2012

(87) PCT Pub. No.: WO2011/134617
PCT Pub. Date: Nov. 3, 2011

(65) Prior Publication Data
US 2013/0068295 A1    Mar. 21, 2013

(30) Foreign Application Priority Data

Apr. 27, 2010    (DE) .......................... 10 2010 028 277

(51) Int. Cl.
*H01L 31/18* (2006.01)
*H01L 31/0224* (2006.01)
(Continued)

(52) U.S. Cl.
CPC ...... H01L 31/022425 (2013.01); *C03C 17/002* (2013.01); *C03C 17/22* (2013.01);
(Continued)

(58) Field of Classification Search
CPC ............... H01L 31/022425; H01L 31/022466; H01L 31/1828
USPC .......................................... 136/256, 255, 252
See application file for complete search history.

(56) References Cited

U.S. PATENT DOCUMENTS 4,504,526 A    3/1985   Hofer et al.
6,103,015 A    8/2000   Zhu
(Continued)

FOREIGN PATENT DOCUMENTS

DE           2500398 A1     12/1975
WO      2006023262 A2      3/2006

*Primary Examiner* — Golam Mowla
(74) *Attorney, Agent, or Firm* — Fraser Clemens Martin & Miller LLC; James D. Miller

(57) ABSTRACT

The invention relates to a process for producing a glass sheet 10, 21 coated with a semiconductor material, which comprises the steps (a) production of a glass strip in a float bath 3 containing liquid tin; (b) discharge of the glass strip from the float bath 3 and optionally coating of the glass strip with a transparent, electrically conductive intermediate layer; (c) transfer of the uncoated or coated glass strip into a deposition chamber 5 for the physical deposition of the semiconductor material from the gas phase; and (d) coating of the coated or uncoated glass strip from step (c) with the semiconductor material by physical deposition of the semiconductor material from the gas phase at a gas pressure of at least 0.1 bar. The invention additionally relates to an apparatus for producing a glass strip coated with a semiconductor material, a process for producing a solar cell or a solar module and also a solar cell or a solar module which can be obtained by this process.

14 Claims, 2 Drawing Sheets

(51) Int. Cl.
    *C03C 17/00*     (2006.01)
    *C03C 17/22*     (2006.01)
    *C03C 17/34*     (2006.01)
    *C03C 17/36*     (2006.01)
    *C23C 14/06*     (2006.01)
    *C23C 14/58*     (2006.01)
    *H01L 31/0392*     (2006.01)
    *H01L 31/20*     (2006.01)

(52) U.S. Cl.
    CPC .......... *C03C 17/347* (2013.10); *C03C 17/3476* (2013.01); *C03C 17/36* (2013.01); *C03C 17/3678* (2013.01); *C03C 2217/288* (2013.01); *C03C 2217/289* (2013.01); *C03C 2218/15* (2013.01); *C23C 14/0629* (2013.01); *C23C 14/5846* (2013.01); *H01L 31/03925* (2013.01); *H01L 31/206* (2013.01); *H01L 31/022466* (2013.01); *H01L 31/1828* (2013.01); *Y02E 10/50* (2013.01)

(56) References Cited

U.S. PATENT DOCUMENTS

| | | | |
|---|---|---|---|
| 6,362,414 B1 * | 3/2002 | Fujisawa et al. | 136/256 |
| 7,597,930 B2 * | 10/2009 | Boire et al. | 427/166 |
| 2004/0248340 A1 | 12/2004 | Romeo et al. | |
| 2006/0188730 A1 | 8/2006 | Varanasi et al. | |
| 2006/0236940 A1 | 10/2006 | Powell et al. | |
| 2009/0113935 A1 * | 5/2009 | Suzuki et al. | 65/64 |

* cited by examiner

PROCESS AND APPARATUS FOR PRODUCING A GLASS SHEET COATED WITH A SEMICONDUCTOR MATERIAL

The invention relates to a process and an apparatus for producing a glass sheet coated with a semiconductor material in a float glass plant. The invention additionally relates to a solar cell and a solar module and also the process for their production.

The glass from a float glass plant (also designated as "float glass" below) is frequently used for the production of glass that is coated with a semiconductor material. In the float glass process, the glass raw materials are first mixed in a float glass plant, melted in a melting furnace and subsequently poured onto a bath of liquid tin (also described as a "float bath" below), which is suitably enclosed to prevent oxidation of the liquid tin. For this, a reducing gas atmosphere of nitrogen and hydrogen is frequently employed. A continuous glass strip results, which is transported through the float plant by means of suitable assemblies, wherein desired glass strip thicknesses and widths can be adjusted. After leaving the float bath, for this purpose the glass strip enters a cooling channel consisting of various cooling chambers and in the end result is in general cooled to ambient temperature and cut into suitable glass plates after removal of the edge.

For the coating of these glass plates with different materials, heating of the glass plates to a suitable deposition temperature is in turn then necessary. On account of the necessity of a fresh heating of the glass plates, these processes, however, are very inefficient, both from the energy and time point of view. Processes have therefore been developed with which a coating, e.g. with a semiconductor material, can even be performed in a float glass plant.

Chemical processes of gas-phase deposition (CVD processes) are often used to continuously coat glass substrates in a float glass process during the production of the glass. Chemical gas-phase deposition in general comprises the formation of a coating of a metal, of a metallic compound, a metal oxide or a combination thereof on a surface of a hot glass substrate, by contacting the surface with a gaseous mixture or precursor which contains the evaporated substance, which then undergoes a chemical reaction or decomposition. The continuous glass strip of the float glass process serves here as a substrate, on which a coating can be deposited.

In U.S. Pat. No. 6,103,015, an apparatus for the coating of a surface of a glass plate is described, which comprises a supply line for the supply of a gaseous precursor mixture. The apparatus can be arranged in a float bath, in a cooling chamber or in a region of a float glass plant lying in between. A chemical gas-phase deposition (chemical vapor deposition, CVD) of various coatings is then carried out, while the glass strip on the apparatus is led past. In FIG. 1 of U.S. Pat. No. 6,103,015, three CVD precipitators are arranged within the float bath.

In US 2006/0188730 A1, glass articles are described in which glass substrates are coated on one or more surfaces with a pyrolytic antireflection layer. The dazzle-suppressing layers are suitably applied by means of conventional thin-film coating processes. For example, the layers can be applied to a float glass substrate in the heated zone of a float glass plant by known processes of chemical gas-phase deposition, other known pyrolytic processes, sol-gel techniques or sputtering processes. In the examples, the production of an antireflection layer arrangement of tin oxide, silicon oxide and tin fluoride during the float glass production process by means of atmospheric chemical gas-phase deposition on the glass substrate is described.

WO 2006/023262 A2 describes a process for the coating of a substrate at atmospheric pressure, which comprises the following steps:
evaporating a controlled amount of semiconductor material under essentially atmospheric pressure within a heated inert gas stream to produce a fluid mixture which has a temperature above the condensation temperature of the semiconductor material; conducting the fluid mixture at essentially atmospheric pressure onto the substrate, which has a temperature below the condensation temperature of the semiconductor material; and depositing a layer of the semiconductor material on a surface of a substrate.

The process described in WO 2006/023262 A2 as atmospheric chemical gas-phase deposition, that taken strictly is an atmospheric physical gas-phase deposition, serves in particular for the production of photovoltaic panels. For example, cadmium sulfide (CdS) and cadmium telluride (CdTe) are evaporated and deposited on the surface of a heated substrate, in particular glass, at atmospheric pressure to form a first thin film of cadmium sulfide and a second thin film of cadmium telluride.

Carrying out a physical gas-phase deposition in a float glass plant is so far unknown. So far, it has also been assumed that the high deposition rates necessary in a float glass plant, in general 60-100 nm/s, can only be obtained by means of chemical gas-phase deposition (cf. "Glass—Mechanics and Technology", by Eric Le Bourhis, WILEY-VCH, 2008; page 212).

Against this background, the object of the present invention was to extend the possibilities for the coating of a glass substrate in a float glass plant. A further object of the present invention was to demonstrate a process with which, in a simple, cost-efficient and time-efficient manner, glass substrates coated with a semiconductor material can be produced for solar cells or solar modules.

This object is achieved by a process for producing a glass sheet coated with a semiconductor material according to claim 1, a device for producing a glass sheet coated with a semiconductor material according to claim 14, a process for producing a solar cell or a solar module according to claim 16 and a solar cell or a solar module according to claim 17. Advantageous refinements are indicated in the dependent claims.

The solution to this object is achieved according to this invention by a process for producing a glass sheet coated with a semiconductor material and a device for this and also a process for producing a solar cell or a solar module and a solar cell obtainable by this process or a solar module obtainable by this process of the corresponding independent patent claims. Preferred embodiments are listed in corresponding dependent patent claims. Preferred embodiments of the process according to the invention correspond to preferred embodiments of the device according to the invention and conversely, even if this is not explicitly established herein.

The subject of the invention is therefore a process for producing a glass sheet coated with a semiconductor material, comprising the steps
(a) production of a glass strip in a float bath containing liquid tin;
(b) discharge of the glass strip from the float bath and optionally coating of the glass strip with a transparent, electrically conductive intermediate layer;

(c) transfer of the uncoated or coated glass strip to a deposition chamber for the physical deposition of the semiconductor material from the gas phase; and (d) coating of the coated or uncoated glass strip from step (c) with the semiconductor material by physical deposition of the semiconductor material from the gas phase at a gas pressure of at least 0.1 bar.

The float bath employed in the process according to the invention is in general part of a device for producing float glass. In general, a continuous glass strip is produced in such a device for producing float glass (float glass plant) as described above.

A physical gas-phase deposition is understood according to the invention as meaning a gas-phase deposition in which a chemical substance present in the gas phase is deposited on a substrate essentially chemically unchanged. In contrast to this, in chemical gas-phase deposition on a heated substrate a chemical reaction takes place, in which the semiconductor material present in the gas phase or its precursor chemically changes.

In physical gas-phase deposition, in general the temperature of the semiconductor material present in the gas phase (also designatable as the temperature of the gas phase) is therefore higher than the temperature of the substrate surface, on which the deposition should take place.

According to the invention, it has turned out to be advantageous if the temperature of the substrate surface is lower by at least 200° C., preferably by at least 250° C., than the temperature of the gas phase.

In the process according to the invention, the glass strip in step (a) is preferably produced at a temperature in the range from 600 to 1200° C. and the glass strip in step (d) is preferably coated after setting a temperature of below 700° C.

The glass strip in general cools before carrying out the coating. Preferably, the coating is carried out immediately after leaving the float bath or when adequate cooling has taken place. The glass strip, however, can also first of all be cooled to a comparatively low temperature and again adjusted to a temperature desired for the coating before coating. Since this is energetically disadvantageous, in general fresh heating of the glass strip is avoided.

In a preferred embodiment of the process according to the invention, the glass strip in step (d) is therefore coated after cooling to a temperature of below 600° C.

In contrast to many gas-phase coating processes, the present process is carried out not in vacuo, but at a comparatively high pressure. The coating in step (d) is preferably carried out at a gas pressure of greater than 0.5 bar and more preferably at a gas pressure in the range from 0.8 to 1.2 bar.

In general, the pressure in the deposition chamber is adjusted using a carrier gas, in particular an inert carrier gas. Advantageously, nitrogen or a rare gas can be used for this. Nitrogen is particularly preferred according to the invention.

The semiconductor material is not restricted according to the invention, as long as a physical gas-phase deposition can be carried out using it. In general, the semiconductor material is selected from III-V compounds and II-VI compounds.

Examples of preferred III-V compounds are nitrides, phosphides and arsenides.

Examples of preferred II-VI compounds are sulfides, selenides and tellurides.

CdS or CdTe is very particularly preferably employed according to the invention as a semiconductor material.

In a preferred embodiment of the process, in one step (e1) a chemical treatment of the semiconductor layer is carried out at a temperature in the range from 300 to 500° C.

As the chemical treatment, preferably a treatment of the semiconductor layer with a chlorine-containing agent is carried out.

In the case of cadmium telluride, the chemical treatment can consist, for example, in applying a solution of cadmium chloride to the cadmium telluride situated on the glass strip and holding it at a temperature in the range from 380 to 430° C. for a period of 10 to 45 min. By this means, a recrystallized cadmium telluride is obtained that is particularly highly suitable for use in photovoltaics, i.e. in solar cells.

In a preferred embodiment of the process according to the invention, the coating in step (d) is carried out at a temperature in the range from 550 to 600° C.

In the physical gas-phase deposition carried out in step (d), in general a powder of a semiconductor material, which preferably has a special particle size distribution, is fed using a small amount of an inert carrier gas to an evaporator of a distribution system (that is also designated as a "distributor"). In the evaporator, the powder, in general with the supply of a primary deposition gas, is heated until it changes to the gaseous state. Carrier gas and deposition gas can be identical, e.g. in each case nitrogen.

In general, care is taken in the process according to the invention that optimal ranges for the molar proportions of powder, carrier gas and primary deposition gas are maintained as a function of a semiconductor material to be deposited. If in fact, for example, the molar ratio between powder and first deposition gas is too large, the probability of a homogeneous nucleation can also be large and as a result a poor quality of the semiconductor layer can result. Homogeneous nucleation in particular means that the formation of dust occurs on account of a self-condensation of the primary carrier gas-powder mixture. A dusty, poorly adhering coating having a low density would thereby result.

The process of the invention offers the great advantage that a float glass process can be modified such that not only a physical deposition can be carried out, but also many further steps can be carried out such that in the end result a desired product, for example a solar cell, can be obtained.

In a further embodiment of the process according to the invention, subsequently to step (d) the following steps (e) chemical and thermal treatment of the semiconductor layer;

(f) structuring;

(g) filling of the structures produced by structuring;

(h) production of an electrically conductive contact layer on the semiconductor layer; and/or (i) encapsulation are therefore carried out in the vicinity of the deposition chamber. Here, "in the vicinity" is to be interpreted broadly and includes all cases in which the deposition chamber is situated in the same factory as the float glass plant, so that no transport of the glass strip over a distance several km long is necessary.

The chemical and thermal treatment of the semiconductor layer (e) can be, for example, an activation of the semiconductor material in the semiconductor layer, for example by a recrystallization.

In the case of cadmium telluride, for the chemical/thermal activation, for example, application of a 20 to 40% strength cadmium chloride solution with subsequent thermal treatment at 380 to 420° C. is particularly suitable.

The structuring of the semiconductor layer in particular means that certain parts of the semiconductor layer are removed again. Processes by means of lasers or mechanical scrapers are in particular suitable for this.

Particularly preferably, the structuring is carried out using a laser (also designated as "laser structuring" below).

Instead of the removed semiconductor material, in general either an electrically better-conducting material or an insulating material is incorporated into the structured semiconductor layer.

Electrically better-conducting materials are, for example, metals such as molybdenum, chromium, aluminum or combinations of metals, molybdenum being preferably suitable.

Photoactive lacquers, for example, are suitable for insulating materials. As a result of the structuring and a subsequent filling with another material, certain areas of the semiconductor layer can be insulated from one another or connected with one another in an electrically conductive manner as desired.

According to the invention, it is very particularly preferred that the steps (e), (f), (g), (h) and/or (i) are carried out as steps for producing a solar cell. I.e., that, for example, the structuring is carried out such that a solar module, which comprises a plurality of solar cells, is formed, wherein n- and p-doped areas of adjacent solar cells are electrically connected to one another.

In a preferred embodiment of the process according to the invention, in step (b) the glass strip is coated with a transparent, electrically conductive intermediate layer that contains a metal oxide. An example of a transparent, electrically conductive intermediate layer is a tin oxide layer, which can be produced, for example, starting from an organotin compound, e.g. $(CH_3)_2SnCl_2$, and oxygen, by means of chemical gas-phase deposition.

The invention additionally relates to a device for producing a glass strip coated with a semiconductor material, comprising
(i) a float bath for producing a glass strip; and
(ii) a deposition chamber for the physical deposition of the semiconductor material from the gas phase.

The float bath in general contains liquid tin. The float bath can in particular be part of a conventional float glass plant for producing float glass.

The apparatus, in particular a float glass plant, can be a float glass plant specially adapted to carrying out a process according to the invention or else a float glass plant, in which a process according to the invention is only optionally carried out.

In a preferred embodiment, the apparatus has
(iii) a treatment chamber for the chemical treatment of the semiconductor layer;
(iv) a structuring unit;
(v) a filling device for the filling of the structures produced by the structuring;
(vi) a further structuring unit,
(vii) a coating apparatus for producing an electrically conductive contact layer on the semiconductor layer; and/or
(viii) an encapsulation device.

The treatment chamber can consist, for example, of a metering device for the homogeneous application of a concentrated salt solution with a subsequent chamber for the thermal treatment in the temperature range from 380 to 420° C.

For the structuring, laser systems are suitable that operate at environmental temperature, i.e. should be integrated into the float glass line as a switchable plant after cooling and cutting of the glass strip.

A system for applying a photoactive lacquer layer using a drying oven, UV exposure unit and subsequent wet bench for the development of the photoactive substance in the structuring trenches can likewise be used, for example, as a switchable plant.

After a further laser structuring, a vacuum coating plant is suitable for coating the back contact—e.g. by molybdenum coating.

The back contact layer can moreover be chemically pre- and thermally after-treated, which has proven very advantageous for the production of solar modules.

Further process stages for (laser) structuring, contacting and encapsulation of the solar module, for example, can follow the back contact layer thus produced.

Since conventional float glass lines frequently have further processing stages in the form of vacuum coating plants and also lamination plants for encapsulation, very efficient synergy effects result due to the combined use of these systems for further processing of the glass as well as for the process for producing solar modules presented here. Moreover, for example, the cutting, transport and stacking systems of a float glass line (in general designated as "cold end") could be followed according to need by an automation, installed in parallel, of the process steps described above for producing the finished solar modules.

The subject of the invention is additionally a process for producing a solar cell or a solar module, comprising a process described herein.

Finally, a subject of the invention is a solar cell or solar module, obtainable by this process.

The invention has the advantage that a glass strip coated with a semiconductor material can be produced rapidly and in an energy-efficient manner, since a detour via a cooled glass strip is not necessary. The necessity for transport of a glass strip to a coating plant (deposition chamber) possibly far removed from a float glass plant is moreover inapplicable.

The invention is described below with the aid of an exemplary working example meant to be non-restrictive.

Figure 1:
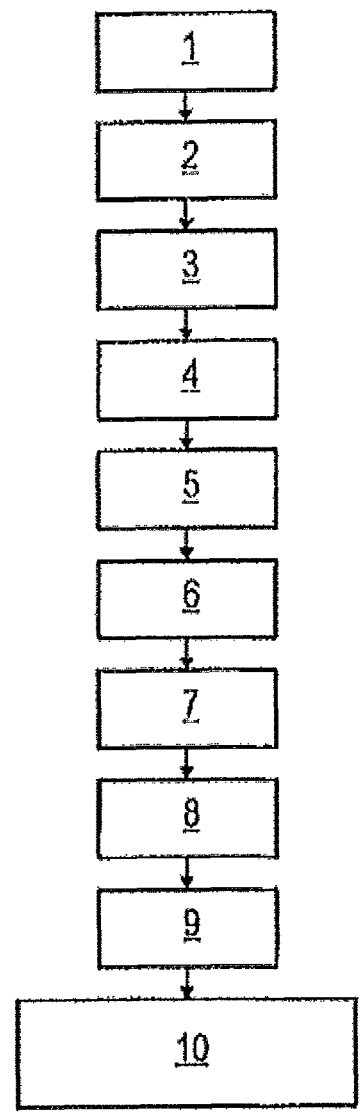
FIG. 1 shows a scheme for producing a glass strip coated with a semiconductor material.

According to scheme 23 of FIG. 1, the starting substances for producing a glass strip, e.g. sand, soda, dolomite, limestone, sodium sulfate and carbon, are firstly mixed in a suitable mixing device 1. The mixture then arrives in a melting furnace 2, which is operated, for example, at a temperature in the range from 1450 to 1550° C., in particular at approximately 1500° C. The molten mass is first homogenized and cooled to about 1100° C. before it is then poured onto the molten tin situated in a float bath 3. A temperature in the range from 1100 to 600° C. prevails in the float bath in this working example. By means of suitable machines ("toprollers") and temperature management a continuous glass strip is produced from the liquid glass mass in this float bath, which is customarily operated under a protective gas atmosphere of nitrogen and hydrogen for the avoidance of oxidation phenomena of the tin and impurities associated therewith. After an endless glass strip has been produced in float bath 3 in this manner in a step (a), the glass strip is discharged from the float bath 3 in a step (b).

In the embodiment shown in FIG. 1, in step (b) the glass strip is additionally coated in a CVD chamber 4 ("chamber for chemical gas-phase vaporization") with a transparent, electrically conductive intermediate layer, which contains a metal oxide, presently tin oxide. This takes place here at a temperature in the range from 600 to 570° C.

Subsequently, the glass strip coated with tin oxide is transferred in step (c) to a deposition chamber 5 for the physical deposition of the semiconductor material, here cadmium sulfide and cadmium telluride, from the gas phase. In step (d), the coating of the glass strip already coated with tin oxide from step (c) with the semiconductor material then takes place by physical deposition of the semiconductor material from the gas phase at a gas pressure of at least 0.1 bar, in the present example 1 bar. This takes place in the working example shown here at a temperature of 570° C.

Subsequently, in the embodiment shown here the glass strip coated with the layer structure described is cooled in a first cooling device 6. For this cooling, there is customarily a cooling channel, in which heat is removed by indirect heat transfer from the coated glass strip by the cooling medium air. In the case of coating with cadmium telluride (CDTE) as a semiconductor material, for example, a cooling from 570° C. to 400° C. is performed in the cooling device.

Subsequently, the CdTe is treated with a cadmium chloride solution for a period of 15 to 20 minutes in a connectable treatment chamber 7 at a temperature in the range from 390 to 425° C. The CdTe is activated in this csse by recrystallization and is then suitable in particular for photovoltaic applications. Since this process proceeds within the cooling channel of the float glass plant, a considerable energy saving is possible, since a fresh heating of the glass substrates as is necessary in conventional plants for producing CdTe solar modules is not required.

In a second cooling device 8, the coated glass strip is cooled to ambient temperature, e.g. 25° C., and subsequently cut in a cutting line 9 to give suitable coated glass plates 10. On account of the integration into the float glass plant, this can be carried out on the plant equipment present for the cutting of the float glass substrates.

Figure 2:
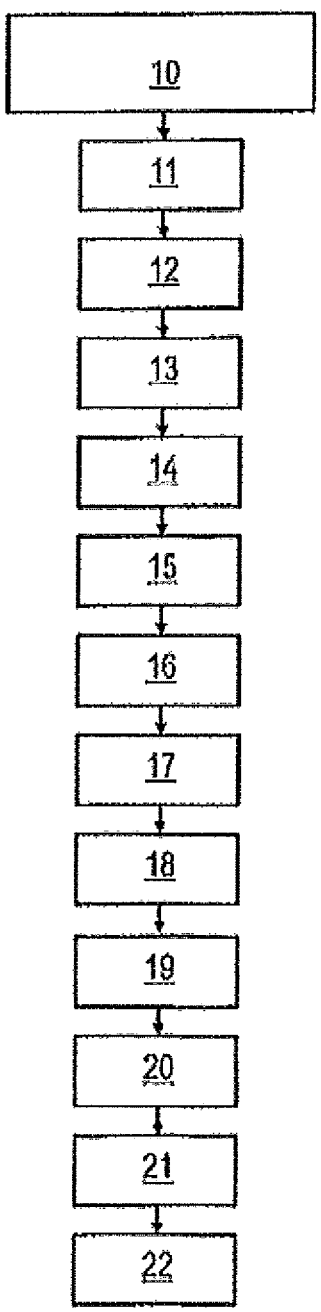
FIG. 2 shows a scheme for producing a glass strip coated with a semiconductor material, after further steps have been carried out, starting from the glass strip coated with a semiconductor material obtained according to the scheme in FIG. 1.

The scheme shown in FIG. 2 shows further processing steps on the glass sheet coated with a semiconductor material, here CdTe, produced according to the scheme of FIG. 1.

The glass sheet 10 coated with a semiconductor material is next transferred to a first structuring part 11, where the semiconductor layer is structured on the glass sheet 10, for example by means of a laser, by sputtering a part of the layer as desired.

Subsequently, the structures obtained are filled with a suitable material, e.g. an insulator, using a filling device 12. In this case, for example, the application of a thin photoactive lacquer is advantageous, which is subsequently treated thermally at about 80-120° C. and subsequently cured on the structures to be insulated by means of UV light. A further structuring with a laser in a second structuring part 13 and a chemical treatment in a chemical treatment chamber 14 follow this. A further coating—the "metallic back contact" is performed in a second coating device 15, for example a sputtering device. Since these sputtering plants is very often present as a further processing process in float glassworks, very efficient synergy effects can also be utilized here. This coating follows a fresh structuring of the applied back contact in a third structuring part 16. The individual cells of the CdTe substrates manufactured after stripping of the edge in the edge stripping part 17 are subsequently interconnected with one another by applying metallic contact strips in a contacting device 18. Finally, the coated glass plate arrives in a chamber 19 for the treatment with butyltin and also in an encapsulation device 20, in which the coated glass sheet, on which the steps described above have been performed, is encapsulated with a suitable polymer film by lamination. Such lamination plants are also often present as further processing steps in float glassworks and could in this case equally be utilized for the manufacture of solar modules. As a result, a further processed glass sheet 21 coated with a semiconductor material and suitable for the end use, e.g. as a solar cell or solar module, is obtained with which finally a further final assembly necessary for use, for example, as a solar module takes place only in a final assembly device 22.

LIST OF REFERENCE SYMBOLS

1 Mixing device
2 Melting furnace
3 Float bath
4 CVD chamber
5 Deposition chamber
6 First cooling device
7 Treatment chamber
8 Second cooling device
9 Cutting line
10 Glass sheet coated with a semiconductor material
11 First structuring part
12 Filling device
13 Second structuring part
14 Chemical treatment chamber
15 Second coating device (e.g. sputtering device)
16 Third structuring part
17 Edge stripping part
18 Contacting device
19 Chamber for the treatment with butyltin
20 Encapsulation device
21 Glass sheet coated with a semiconductor material after further processing (e.g. solar cell or solar module)
22 Final assembly device
23 Scheme for producing a glass strip coated with a semiconductor material

The invention claimed is:

1. A process for producing a glass sheet (10, 21) coated with a semiconductor material, comprising the steps
   (a) production of a continuous glass strip in a float bath (3) containing liquid tin;
   (b) discharge of the glass strip from the float bath (3) and optionally coating of the glass strip with a transparent, electrically conductive intermediate layer;
   (c) transfer of the uncoated or coated glass strip to a deposition chamber (5) for the physical deposition of the semiconductor material from the gas phase;
   (d) coating of the coated or uncoated glass strip from step (c) with the semiconductor material by physical deposition of the semiconductor material from the gas phase at a gas pressure of at least 0.1 bar and
   (d) cutting of the glass strip coated with semiconductor material for the production of the glass sheet (10, 21).

2. The process as claimed in claim 1, characterized in that the glass strip in the step (a) is produced at a temperature in the range from 600 to 1200° C. and the glass strip in the step (d) is coated after setting a temperature of below 700° C.

3. The process as claimed in claim 2, characterized in that the glass strip in the step (d) is coated after cooling to a temperature of below 600° C.

4. The process as claimed in one of claims 1 to 3, characterized in that the coating in the step (d) is carried out at a gas pressure of greater than 0.5 bar.

5. The process as claimed in claim 3, characterized in that the coating in the step (d) is carried out at a gas pressure in the range from 0.8 to 1.2 bar.

6. The process as claimed in one of claims 1 to 5, characterized in that the semiconductor material is selected from III-V compounds and II-VI compounds.

7. The process as claimed in claim 6, characterized in that the semiconductor material comprises CdS or CdTe.

8. The process as claimed in one of claims 1 to 7, characterized in that the coating in the step (d) is carried out at a temperature in the range from 550 to 600° C.

9. The process as claimed in one of claims 1 to 8, characterized in that subsequently to the step (d) the following steps
   (e) chemical and thermal treatment of the semiconductor layer;
   (f) structuring;
   (g) filling of the structures produced by structuring;
   (h) production of an electrically conducting contact layer on the semiconductor layer; and/or
   (i) encapsulation;
are carried out.

10. The process as claimed in claim 9, characterized in that the steps (e), (f), (g), (h) and/or (i) are carried out as steps for producing a solar cell (21).

11. The process as claimed in one of claims 1 to 10, characterized in that in the step (b) the glass strip is coated with a transparent, electrically conductive intermediate layer that contains a metal oxide.

12. The process as claimed in one of claims 9 to 11, characterized in that the thermal treatment of the semiconductor layer is carried out at a temperature in the range from 300 to 500° C.

13. The process as claimed in one of claims 9 to 12, characterized in that the chemical treatment of the semiconductor layer is carried out by treatment with a chlorine-containing agent.

14. A process for producing a solar cell or a solar module, comprising a process as claimed in one of claims 9 to 13.

* * * * *